US010157646B2

(12) United States Patent
Kim

(10) Patent No.: US 10,157,646 B2
(45) Date of Patent: Dec. 18, 2018

(54) LATCH CONTROL SIGNAL GENERATION CIRCUIT TO REDUCE ROW HAMMERING

(71) Applicant: SK hynix Inc., Icheon-si Gyeonggi-do (KR)

(72) Inventor: Chang Hyun Kim, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/454,633

(22) Filed: Mar. 9, 2017

(65) Prior Publication Data

US 2018/0102148 A1    Apr. 12, 2018

(30) Foreign Application Priority Data

Oct. 6, 2016    (KR) .................. 10-2016-0129367

(51) Int. Cl.
| | |
|---|---|
| *G11C 7/10* | (2006.01) |
| *G11C 8/06* | (2006.01) |
| *G11C 8/18* | (2006.01) |
| *G11C 7/20* | (2006.01) |

(52) U.S. Cl.
CPC ............... *G11C 7/10* (2013.01); *G11C 8/06* (2013.01); *G11C 8/18* (2013.01); *G11C 7/20* (2013.01)

(58) Field of Classification Search
None
See application file for complete search history.

(56) References Cited

U.S. PATENT DOCUMENTS

| | | | | |
|---|---|---|---|---|
| 5,977,739 | A * | 11/1999 | Ohsawa ................. | G05B 19/40 318/400.27 |
| 2002/0089312 | A1* | 7/2002 | Taniguchi ................ | H02P 9/08 322/28 |
| 2009/0091982 | A1* | 4/2009 | Lee ........................ | G11C 16/10 365/185.18 |
| 2014/0052704 | A1* | 2/2014 | Mittal ............... | G06F 17/30321 707/696 |
| 2014/0223246 | A1* | 8/2014 | Kim .................... | G11C 11/5642 714/718 |
| 2015/0213872 | A1 | 7/2015 | Mazumder et al. | |
| 2015/0286571 | A1* | 10/2015 | Cain, III ............. | G06F 12/0862 711/123 |
| 2016/0203047 | A1* | 7/2016 | No ....................... | G06F 11/1068 714/764 |
| 2017/0062040 | A1* | 3/2017 | Cho .................... | G11C 11/4074 |

FOREIGN PATENT DOCUMENTS

KR    1020140100752 A    8/2014

* cited by examiner

*Primary Examiner* — Son Dinh
*Assistant Examiner* — Sultana Begum
(74) *Attorney, Agent, or Firm* — William Park & Associates Ltd.

(57) ABSTRACT

A semiconductor device may be provided. The semiconductor device may include a latch control signal generation circuit configured to compare a count signal counted according to the number of times that a command is inputted to the latch control signal generation circuit with a random signal having a random combination to generate a latch control signal which is enabled, based on an update signal. The semiconductor device may include a storage circuit configured to latch an address to generate a latched address, based on the latch control signal. The semiconductor device may include an internal circuit configured to receive the latched address to execute an internal operation.

24 Claims, 12 Drawing Sheets

| INPUT NUMBER OF TIMES OF COMMAND | AC<1> | AC<2> | AC<3> | AC<4> | AC<5> | AC<6> | AC<7> | AC<8> | PROBABILITY |
|---|---|---|---|---|---|---|---|---|---|
| ONCE | H | L | L | L | L | L | L | L | 1 |
| TWICE | L | H | L | L | L | L | L | L | 0.5 |
| THREE TIMES | H | H | L | L | L | L | L | L | 0.5 |
| FOUR TIMES | L | L | H | L | L | L | L | L | 0.25 |
| FIVE TIMES | H | L | H | L | L | L | L | L | 0.25 |
| SIX TIMES | L | H | H | L | L | L | L | L | 0.25 |
| SEVEN TIMES | H | H | H | L | L | L | L | L | 0.25 |

FIG. 9

| RC<1> | RC<2> | RC<3> | RC<4> | RC<5> | RC<6> | RC<7> | RC<9> |
|---|---|---|---|---|---|---|---|
| H | L | L | H | L | L | H | L |

| AC<1> | AC<2> | AC<3> | AC<4> | AC<5> | AC<6> | AC<7> | AC<8> |
|---|---|---|---|---|---|---|---|
| H | L | L | H | L | H | L | L |

AC<6> ← MSB

SAME COMBINATION

FIG. 10

| INPUT NUMBER OF TIMES OF COMMAND | AC<1> | AC<2> | AC<3> | AC<4> | AC<5> | AC<6> | AC<7> | AC<8> | PROBABILITY |
|---|---|---|---|---|---|---|---|---|---|
| ONCE | H | L | L | L | L | L | L | L | 1 |
| TWICE | L | H | L | L | L | L | L | L | 0.5 |
| THREE TIMES | H | H | L | L | L | L | L | L | 0.5 |
| FOUR TIMES | L | L | H | L | L | L | L | L | 0.25 |
| FIVE TIMES | H | L | H | L | L | L | L | L | 0.25 |
| SIX TIMES | L | H | H | L | L | L | L | L | 0.25 |
| SEVEN TIMES | H | H | H | L | L | L | L | L | 0.25 |

LATCH CONTROL SIGNAL GENERATION CIRCUIT TO REDUCE ROW HAMMERING

CROSS-REFERENCE TO RELATED APPLICATIONS

The present application claims priority under 35 U.S.C 119(a) to Korean Application No. 10-2016-0129367, filed on Oct. 6, 2016, which is herein incorporated by reference in its entirety.

BACKGROUND

1. Technical Field

Embodiments of the present disclosure may generally relate to semiconductor devices, and more particularly, to semiconductor devices and random sampling of addresses.

2. Related Art

As semiconductor devices become more highly integrated with the development of circuit and process design technologies, various kinds of failures have been exhibited to cause a malfunction with the semiconductor devices. For example, if a certain word line connected to a plurality of memory cells is repeatedly selected and activated, the electric potential of next word lines adjacent to the selected word line may become unstable due to a coupling phenomenon. In such a case, the unstable electric potential of the next word lines may cause an undesirable leakage current, and the memory cells connected to the next word lines may lose their stored data.

The effect that the repeated access to a certain word line influences the electric potential of next word lines adjacent to the certain word line is referred to as "row hammering". A lot of effort has been focused on reducing the failures which are due to the row hammering.

SUMMARY

According to an embodiment, a semiconductor device may be provided. The semiconductor device may include a latch control signal generation circuit configured to compare a count signal counted according to the number of times that a command is inputted to the latch control signal generation circuit with a random signal having a random combination to generate a latch control signal which is enabled, based on an update signal. The semiconductor device may include a storage circuit configured to latch an address to generate a latched address, based on the latch control signal. The semiconductor device may include an internal circuit configured to receive the latched address to execute an internal operation.

According to an embodiment, a latch control signal generation circuit may be provided. The latch control signal generation circuit may include a comparison circuit configured to compare first to third count signals that are counted according to the number of times that a command is inputted during a set period with first to third random signals having a random combination to generate an enablement signal which is enabled. The latch control signal generation circuit may include a pulse generation circuit configured to generate a latch control signal for latching an address to generate a latched address, the latch control signal including a pulse that is created based on the command and the enablement signal.

According to an embodiment, a latch control signal generation circuit may be provided. The latch control signal generation circuit may include a comparison circuit configured to compare first to third count signals that are counted according to the number of times that a command is inputted during a set period with first to third random signals having a random combination to generate an enablement signal which is enabled. The latch control signal generation circuit may include a pulse generation circuit configured to generate a latch control signal for latching an address to generate a latched address, the latch control signal including a pulse that is created based on the command and the enablement signal. Wherein a probability that the address is latched is controlled according to the number of times that the command is inputted.

According to an embodiment, the latch control signal generation circuit may be provided. The latch control signal generation circuit may include a comparison signal generation circuit configured to generate a comparison signal which is enabled if a combination of the first to third count signals is identical to a combination of the first to third random signals. The latch control signal generation circuit may include a detection signal generation circuit configured to generate a detection signal including information that a most significant bit (MSB) of the first to third count signals is counted. The latch control signal generation circuit may include an enablement signal generation circuit configured to generate the enablement signal which is enabled according to the detection signal and the comparison signal based on the update signal and which is disabled based on the command. The latch control signal generation circuit may include a counter configured to generate the first to third count signals that are counted according to the number of times that the command is inputted to the counter, based on the update signal. The latch control signal generation circuit may include a random signal generation circuit configured to generate the first to third random signals based on the update signal.

BRIEF DESCRIPTION OF THE DRAWINGS

FIG. 9 is a table illustrating an example of a representation of an operation of a comparison circuit included in a semiconductor device according to an embodiment.

FIG. 10 is a table illustrating an example of a representation of an operation of a semiconductor device according to an embodiment.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
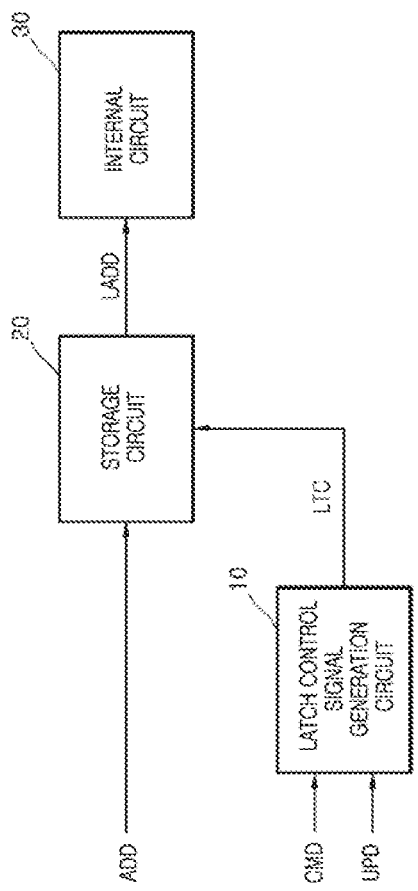
FIG. 1 is a block diagram illustrating an example of a representation of a configuration of a semiconductor device according to an embodiment.

Referring to FIG. 1, a semiconductor device according to an embodiment may include a latch control signal generation circuit 10, a storage circuit 20 and an internal circuit 30.

The latch control signal generation circuit 10 may compare a count signal (AC<1:8> of FIG. 2) with a random signal (RC<1:8> of FIG. 2) to generate a latch control signal LTC, in response to an update signal UPD and a command CMD. The latch control signal generation circuit 10 may generate the latch control signal LTC by comparing the random signal RC<1:8> having a random combination in response to the update signal UPD with the count signal AC<1:8> counted in response to the command CMD. The update signal UPD may be set to include a pulse for defining a set period. The set period may be determined to be a period in which the pulse of the update signal UPD is generated once. The pulse of the update signal UPD may be periodically generated to define the set period. That is, the set period may correspond to a cycle time of the update signal UPD. The command CMD may be transmitted through a line that transmits at least one of an address, a command and data. Although the command CMD is illustrated as a single signal line in FIG. 1, the command CMD may include a plurality of bits according to the embodiments. The count signal AC<1:8> may be counted by the number of times that the command CMD is inputted to the latch control signal generation circuit 10. The random signal RC<1:8> may be generated to have a random combination if the update signal UPD is inputted to the latch control signal generation circuit 10.

The storage circuit 20 may latch an address ADD to generate a latched address LADD, in response to the latch control signal LTC. The storage circuit 20 may latch the address ADD if a pulse of the latch control signal LTC is inputted. The storage circuit 20 may also output the latched address LADD if a pulse of the latch control signal LTC is inputted. The storage circuit 20 may be realized using a single register or a plurality of registers according to the embodiments. The address ADD may be transmitted through lines that transmit at least one of an address, a command and data. Although the command CMD is illustrated as a single signal line in FIG. 1, the command CMD may include a plurality of bits according to the embodiments. The address ADD may be set to be inputted to the storage circuit 20 at a point of time that the command CMD is inputted to the latch control signal generation circuit 10.

The internal circuit 30 may receive the latched address LADD to execute an internal operation thereof. The internal circuit 30 may be realized to include a plurality of memory cells that store data or output the stored data. For example, the internal circuit 30 may be realized using a general volatile memory circuit or a general nonvolatile memory circuit. The internal circuit 30 may receive the latched address LADD to execute an operation for suppressing failures which are due to the row hammering. The operation for suppressing the failures due to the row hammering may correspond to a refresh operation of the memory cells connected to next word lines adjacent to a target word line which is repeatedly selected and activated.

The semiconductor device according to an embodiment may randomly latch the address ADD inputted during the set period to generate samples of the address ADD. The semiconductor device may generate the samples of the address ADD by latching the address ADD inputted during the set period under the same probability. The semiconductor device may randomly latch the address ADD to detect the address having the same combination. As a result, the failures due to the row hammering may be reduced. The probability that the address ADD is latched during the set period will be described later.

Figure 2:
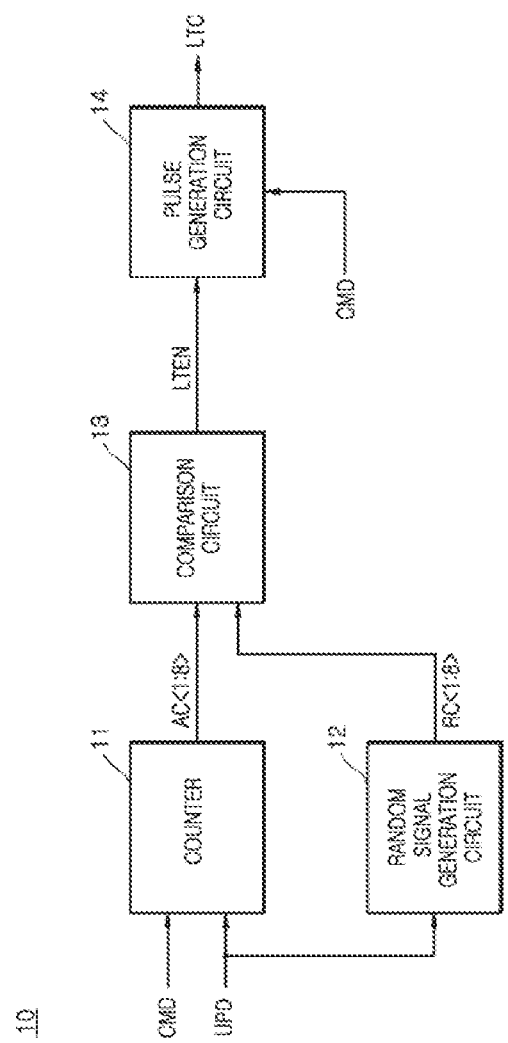
FIG. 2 is a block diagram illustrating an example of a representation of a configuration of a latch control signal generation circuit included in the semiconductor device of FIG. 1.

Referring to FIG. 2, an example of the latch control signal generation circuit 10 may include a counter 11, a random signal generation circuit 12, a comparison circuit 13 and a pulse generation circuit 14.

The counter 11 may generate the count signal AC<1:8> that are counted according to the input number of times of the command CMD, in response to the update signal UPD. The counter 11 may generate the count signal AC<1:8> that are counted up if the command CMD is inputted, in response to the update signal UPD. In some embodiments, the counter 11 may be configured to generate the count signal AC<1:8> that are counted down if the command CMD is inputted, in response to the update signal UPD. The counter 11 may generate the count signal AC<1:8> that are initialized if the update signal UPD is inputted. Although the number of bits included in the count signal AC<1:8> is set to be eight in the present embodiment, the number of bits included in the count signal may be set to be different according to the embodiments.

The random signal generation circuit 12 may generate the random signal RC<1:8> having a random combination in response to the update signal UPD. The random signal generation circuit 12 may generate the random signal RC<1:8> whose combination varies if the update signal UPD is inputted. Although the number of bits included in the random signal RC<1:8> is set to be eight in the present embodiment, the number of bits included in the random signal may be set to be different according to the embodiments. The number of bits included in the random signal RC<1:8> may be set to be equal to the number of bits included in the count signal AC<1:8>.

The comparison circuit 13 may compare the count signal AC<1:8> with the random signal RC<1:8> to generate an enablement signal LTEN. The comparison circuit 13 may generate the enablement signal LTEN which is enabled if the count signal AC<1:8> and the random signal RC<1:8> have the same combination.

The pulse generation circuit 14 may generate the latch control signal LTC in response to the command CMD and the enablement signal LTEN. The pulse generation circuit 14 may generate the latch control signal LTC including a pulse which is created if the enablement signal LTEN is enabled, in response to the command CMD.

Figure 3:
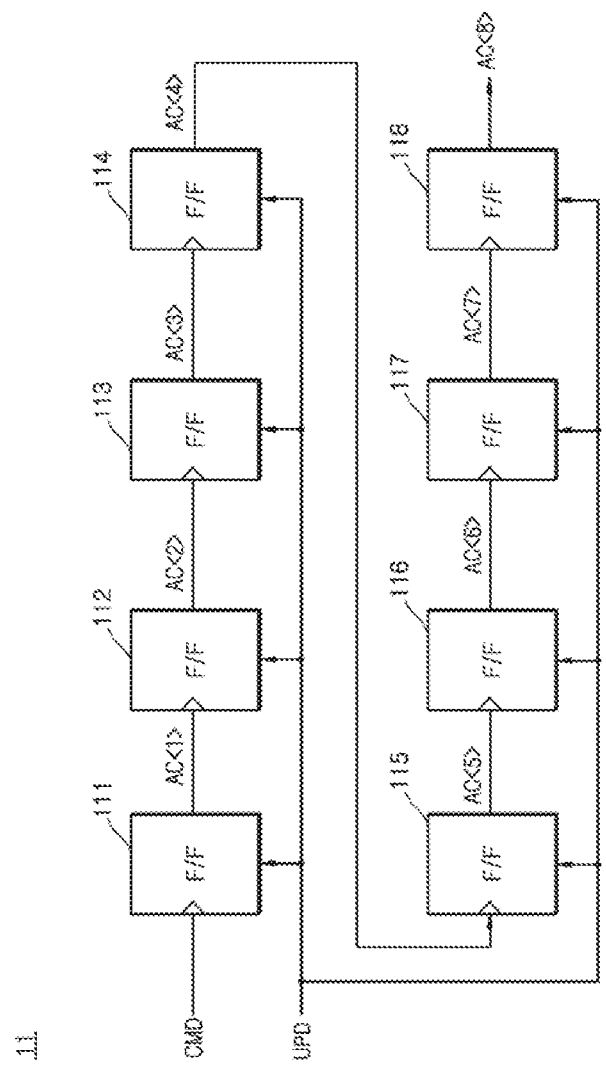
FIG. 3 is a block diagram illustrating an example of a representation of a configuration of a counter included in the latch control signal generation circuit of FIG. 2.

Referring to FIG. 3, an example of the counter 11 may include flip-flops 111, 112, 113, 114, 115, 116, 117 and 118.

The flip-flop 111 may be initialized in response to the update signal UPD and may generate a first count signal AC<1> of the count signal AC<1:8>, which is counted in response to the command CMD. The flip-flop 111 may generate the first count signal AC<1> having a level that varies if the command CMD is inputted.

The flip-flop 112 may be initialized in response to the update signal UPD and may generate a second count signal AC<2> of the count signal AC<1:8>, which is counted in response to the first count signal AC<1>. The flip-flop 112 may generate the second count signal AC<2> whose level varies if a level of the first count signal AC<1> changes from a logic "high" level into a logic "low" level. Further, the logic levels of the signals may be different from or the opposite of those described. For example, a signal described as having a logic "high" level may alternatively have a logic "low" level, and a signal described as having a logic "low" level may alternatively have a logic "high" level.

The flip-flop 113 may be initialized in response to the update signal UPD and may generate a third count signal AC<3> of the count signal AC<1:8>, which is counted in response to the second count signal AC<2>. The flip-flop 113 may generate the third count signal AC<3> whose level varies if a level of the second count signal AC<2> changes from a logic "high" level into a logic "low" level. Further, the logic levels of the signals may be different from or the opposite of those described. For example, a signal described as having a logic "high" level may alternatively have a logic "low" level, and a signal described as having a logic "low" level may alternatively have a logic "high" level.

The flip-flop 114 may be initialized in response to the update signal UPD and may generate a fourth count signal AC<4> of the count signal AC<1:8>, which is counted in response to the third count signal AC<3>. The flip-flop 114 may generate the fourth count signal AC<4> whose level varies if a level of the third count signal AC<3> changes from a logic "high" level into a logic "low" level. Further, the logic levels of the signals may be different from or the opposite of those described. For example, a signal described as having a logic "high" level may alternatively have a logic "low" level, and a signal described as having a logic "low" level may alternatively have a logic "high" level.

The flip-flop 115 may be initialized in response to the update signal UPD and may generate a fifth count signal AC<5> of the count signal AC<1:8>, which is counted in response to the fourth count signal AC<4>. The flip-flop 115 may generate the fifth count signal AC<5> whose level varies if a level of the fourth count signal AC<4> changes from a logic "high" level into a logic "low" level. Further, the logic levels of the signals may be different from or the opposite of those described. For example, a signal described as having a logic "high" level may alternatively have a logic "low" level, and a signal described as having a logic "low" level may alternatively have a logic "high" level.

The flip-flop 116 may be initialized in response to the update signal UPD and may generate a sixth count signal AC<6> of the count signal AC<1:8>, which is counted in response to the fifth count signal AC<5>. The flip-flop 116 may generate the sixth count signal AC<6> whose level varies if a level of the fifth count signal AC<5> changes from a logic "high" level into a logic "low" level. Further, the logic levels of the signals may be different from or the opposite of those described. For example, a signal described as having a logic "high" level may alternatively have a logic "low" level, and a signal described as having a logic "low" level may alternatively have a logic "high" level.

The flip-flop 117 may be initialized in response to the update signal UPD and may generate a seventh count signal AC<7> of the count signal AC<1:8>, which is counted in response to the sixth count signal AC<6>. The flip-flop 117 may generate the seventh count signal AC<7> whose level varies if a level of the sixth count signal AC<6> changes from a logic "high" level into a logic "low" level. Further, the logic levels of the signals may be different from or the opposite of those described. For example, a signal described as having a logic "high" level may alternatively have a logic "low" level, and a signal described as having a logic "low" level may alternatively have a logic "high" level.

The flip-flop 118 may be initialized in response to the update signal UPD and may generate an eighth count signal AC<8> of the count signal AC<1:8>, which is counted in response to the seventh count signal AC<7>. The flip-flop 118 may generate the eighth count signal AC<8> whose level varies if a level of the seventh count signal AC<7> changes from a logic "high" level into a logic "low" level. Further, the logic levels of the signals may be different from or the opposite of those described. For example, a signal described as having a logic "high" level may alternatively have a logic "low" level, and a signal described as having a logic "low" level may alternatively have a logic "high" level.

The initialization of the count signal AC<1:8> means that all of bits of the count signal AC<1:8> are generated to have a logic "low" level. Further, the logic levels of the signals may be different from or the opposite of those described. For example, a signal described as having a logic "high" level may alternatively have a logic "low" level, and a signal described as having a logic "low" level may alternatively have a logic "high" level.

Figure 4:
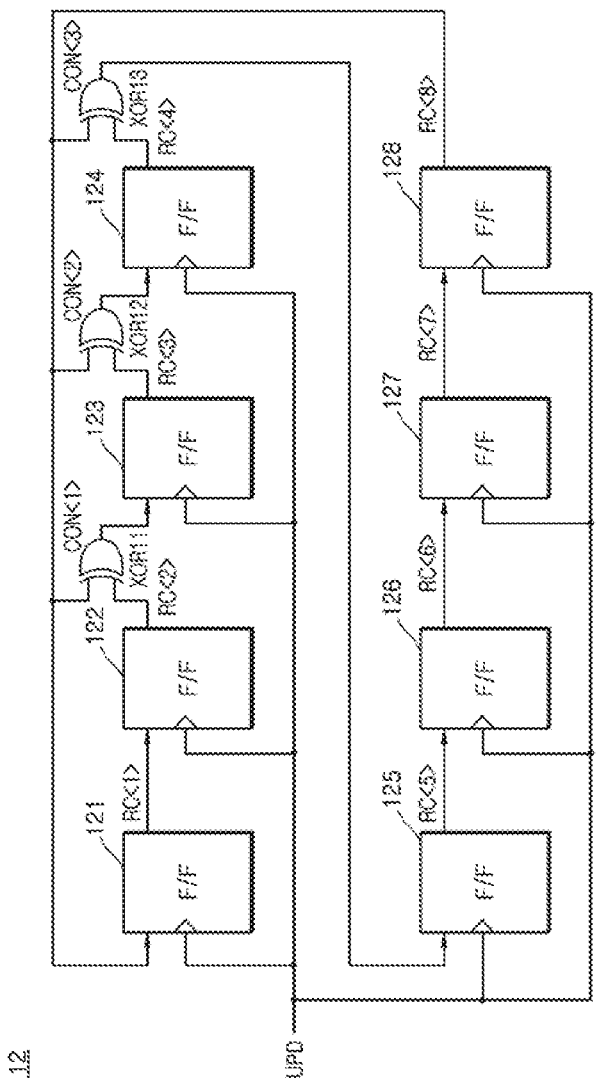
FIG. 4 is a block diagram illustrating an example of a representation of a configuration of a random signal generation circuit included in the latch control signal generation circuit of FIG. 2.

Referring to FIG. 4, an example of the random signal generation circuit 12 may include flip-flops 121, 122, 123, 124, 125, 126, 127 and 128. The random signal generation circuit 12 may include logic gates for performing logic operations. The random signal generation circuit 12 may include logic gates for performing, for example but not limited to, an exclusive OR operation. The random signal generation circuit 12 may include, for example but not limited to, exclusive OR gates XOR11, XOR12 and XOR13.

The flip-flop 121 may receive an eighth random signal RC<8> of the random signal RC<1:8> to output the eighth random signal RC<8> as a first random signal RC<1> of the random signal RC<1:8>, in response to the update signal UPD. The flip-flop 121 may output the eighth random signal RC<8> as the first random signal RC<1> if a pulse of the update signal UPD inputted.

The flip-flop 122 may receive the first random signal RC<1> to output the first random signal RC<1> as a second random signal RC<2> of the random signal RC<1:8>, in response to the update signal UPD. The flip-flop 122 may output the first random signal RC<1> as the second random signal RC<2> if a pulse of the update signal UPD inputted.

The exclusive OR gate XOR11 may compare the eighth random signal RC<8> with the second random signal RC<2> to generate a first control signal CON<1>. The exclusive OR gate XOR11 may generate the first control signal CON<1> having a logic "low" level if the eighth random signal RC<8> and the second random signal RC<2> have the same logic level. The exclusive OR gate XOR11 may generate the first control signal CON<1> having a logic "high" level if the eighth random signal RC<8> and the second random signal RC<2> have different logic levels. Further, the logic levels of the signals may be different from or the opposite of those described. For example, a signal described as having a logic "high" level may alternatively have a logic "low" level, and a signal described as having a logic "low" level may alternatively have a logic "high" level.

The flip-flop 123 may receive the first control signal CON<1> to output the first control signal CON<1> as a third random signal RC<3> of the random signal RC<1:8>, in response to the update signal UPD. The flip-flop 123 may output the first control signal CON<1> as the third random signal RC<3> if a pulse of the update signal UPD inputted.

The exclusive OR gate XOR12 may compare the eighth random signal RC<8> with the third random signal RC<3> to generate a second control signal CON<2>. The exclusive OR gate XOR12 may generate the second control signal CON<2> having a logic "low" level if the eighth random signal RC<8> and the third random signal RC<3> have the same logic level. The exclusive OR gate XOR12 may generate the second control signal CON<2> having a logic "high" level if the eighth random signal RC<8> and the third random signal RC<3> have different logic levels. Further, the logic levels of the signals may be different from or opposite of those described. For example, a signal described as having a logic "high" level may alternatively have a logic "low" level, and a signal described as having a logic "low" level may alternatively have a logic "high" level.

The flip-flop 124 may receive the second control signal CON<2> to output the second control signal CON<2> as a fourth random signal RC<4> of the random signal RC<1:8>, in response to the update signal UPD. The flip-flop 124 may output the second control signal CON<2> as the fourth random signal RC<4> if a pulse of the update signal UPD inputted.

The exclusive OR gate XOR13 may compare the eighth random signal RC<8> with the fourth random signal RC<4> to generate a third control signal CON<3>. The exclusive OR gate XOR13 may generate the third control signal CON<3> having a logic "low" level if the eighth random signal RC<8> and the fourth random signal RC<4> have the same logic level. The exclusive OR gate XOR13 may generate the third control signal CON<3> having a logic "high" level if the eighth random signal RC<8> and the fourth random signal RC<4> have different logic levels. Further, the logic levels of the signals may be different from or the opposite of those described. For example, a signal described as having a logic "high" level may alternatively have a logic "low" level, and a signal described as having a logic "low" level may alternatively have a logic "high" level.

The flip-flop 125 may receive the third control signal CON<3> to output the third control signal CON<3> as a fifth random signal RC<5> of the random signal RC<1:8>, in response to the update signal UPD. The flip-flop 125 may output the third control signal CON<3> as the fifth random signal RC<5> if a pulse of the update signal UPD inputted.

The flip-flop 126 may receive the fifth random signal RC<5> to output the fifth random signal RC<5> as a sixth random signal RC<6> of the random signal RC<1:8>, in response to the update signal UPD. The flip-flop 126 may output the fifth random signal RC<5> as the sixth random signal RC<6> if a pulse of the update signal UPD inputted.

The flip-flop 127 may receive the sixth random signal RC<6> to output the sixth random signal RC<6> as a seventh random signal RC<7> of the random signal RC<1:8>, in response to the update signal UPD. The flip-flop 127 may output the sixth random signal RC<6> as the seventh random signal RC<7> if a pulse of the update signal UPD inputted.

The flip-flop 128 may receive the seventh random signal RC<7> to output the seventh random signal RC<7> as the eighth random signal RC<8>, in response to the update signal UPD. The flip-flop 128 may output the seventh random signal RC<7> as the eighth random signal RC<8> if a pulse of the update signal UPD inputted.

The flip-flops 121-128 and the exclusive OR gates XOR11~XOR13 included in the random signal generation circuit 12 may be disposed at different positions to generate the random signal RC<1:8> having a random combination, according to the embodiments.

Figure 5:
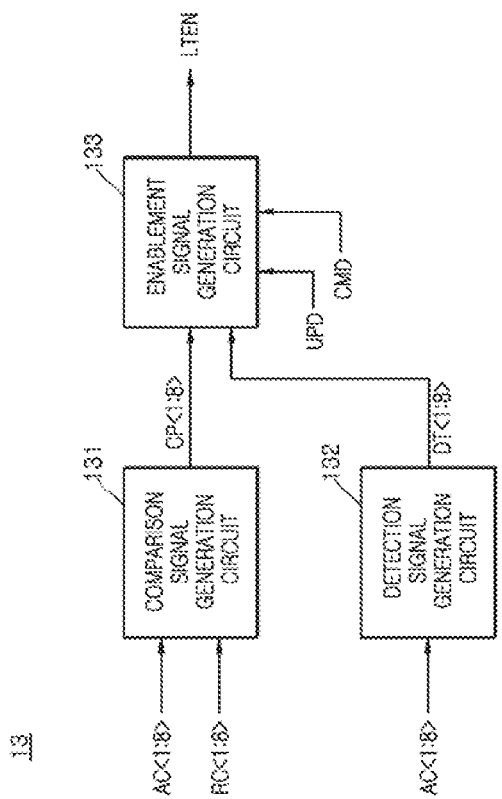
FIG. 5 is a block diagram illustrating an example of a representation of a configuration of a comparison circuit included in the latch control signal generation circuit of FIG. 2.

Referring to FIG. 5, an example of the comparison circuit 13 may include a comparison signal generation circuit 131, a detection signal generation circuit 132 and an enablement signal generation circuit 133.

The comparison signal generation circuit 131 may compare the count signal AC<1:8> with the random signal RC<1:8> to generate a comparison signal CP<1:8>. The comparison signal generation circuit 131 may generate the comparison signal CP<1:8> which is enabled if the count signal AC<1:8> and the random signal RC<1:8> have the same combination. An operation of generating the comparison signal CP<1:8> will be described later.

The detection signal generation circuit 132 may generate a detection signal DT<1:8> in response to the count signal AC<1:8>. The detection signal generation circuit 132 may generate the detection signal DT<1:8> including information that a most significant bit (MSB) of the count signal AC<1:8> is counted. An operation of generating the detection signal DT<1:8> will be described later.

The enablement signal generation circuit 133 may generate the enablement signal LTEN which is enabled according to the detection signal DT<1:8> and the comparison signal CP<1:8> in response to the update signal UPD and which is disabled in response to the command CMD. The enablement signal generation circuit 133 may generate the enablement signal LTEN which is enabled to have a logic "high" level according to the detection signal DT<1:8> and the comparison signal CP<1:8> in response to the update signal UPD. The enablement signal generation circuit 133 may generate the enablement signal LTEN which is disabled to have a logic "low" level in response to the command CMD. A logic level of the enablement signal LTEN, which is enabled, may be set to be different according to the embodiments.

Figure 6:
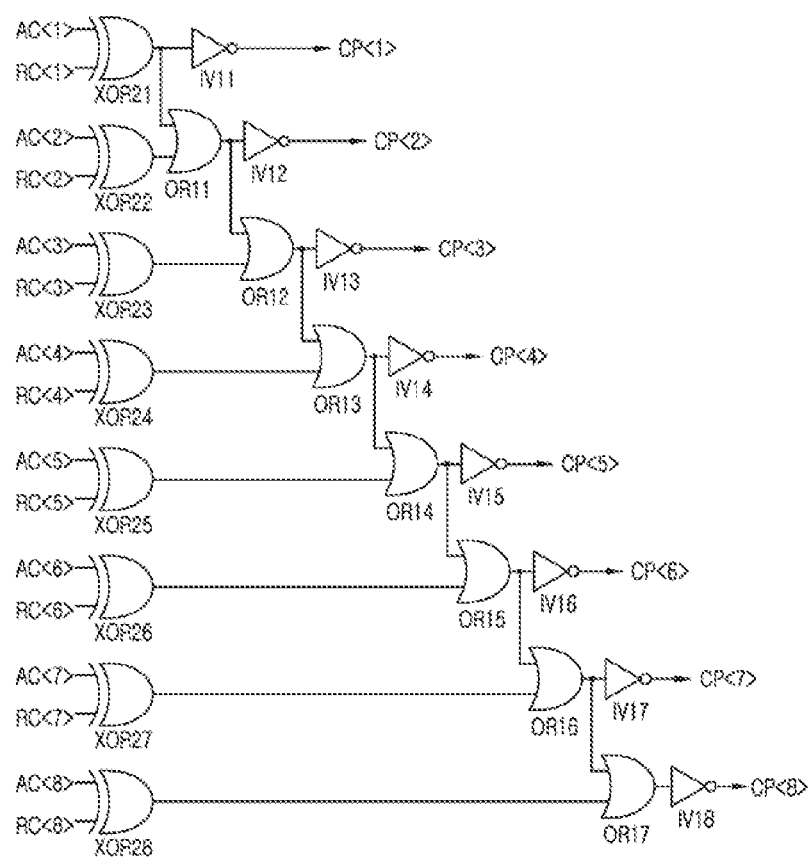
FIG. 6 is a circuit diagram illustrating an example of a representation of a comparison signal generation circuit included in the comparison circuit of FIG. 5.

Referring to FIG. 6, an example of the comparison signal generation circuit 131 may include logic gates for performing logic operations. The comparison signal generation circuit 131 may include logic gates for performing, for example but not limited to, exclusive OR operations, OR operations, and inverting operations. The comparison signal generation circuit 131 may include, for example but not limited to, exclusive OR gates XOR21, XOR22, XOR23, XOR24, XOR25, XOR26, XOR27 and XOR28, OR gates OR11, OR12, OR13, OR14, OR15, OR16 and OR17, and inverters IV11, IV12, IV13, IV14, IV15, IV16, IV17 and IV18. In an embodiment, the logic circuit 1331 may be configured to generate the enablement signal LTEN which is enabled according to a combination of the detection signal DT<1:8> and a combination of the comparison signal CP<1:8>, in response to the reset signal RST. In an embodiment, the reset signal generation circuit 1332 may be configured to generate the reset signal RST which is enabled in response to the update signal UPD and which is disabled in response to the command CMD and the comparison signal CP<1:8>.

The comparison signal generation circuit 131 may generate a first comparison signal CP<1> of the comparison signal CP<1:8>, which is enabled to have a logic "high" level if the first count signal AC<1> and the first random signal RC<1> have the same logic level. Further, the logic levels of the signals may be different from or the opposite of those described. For example, a signal described as having a logic "high" level may alternatively have a logic "low" level, and a signal described as having a logic "low" level may alternatively have a logic "high" level.

The comparison signal generation circuit 131 may generate a second comparison signal CP<2> of the comparison signal CP<1:8>, which is enabled to have a logic "high" level if the second count signal AC<2> and the second random signal RC<2> have the same logic level. Further, the logic levels of the signals may be different from or the opposite of those described. For example, a signal described as having a logic "high" level may alternatively have a logic "low" level, and a signal described as having a logic "low" level may alternatively have a logic "high" level.

The comparison signal generation circuit 131 may generate a third comparison signal CP<3> of the comparison signal CP<1:8>, which is enabled to have a logic "high" level if the third count signal AC<3> and the third random signal RC<3> have the same logic level. Further, the logic levels of the signals may be different from or the opposite of those described. For example, a signal described as having a logic "high" level may alternatively have a logic "low" level, and a signal described as having a logic "low" level may alternatively have a logic "high" level.

The comparison signal generation circuit 131 may generate a fourth comparison signal CP<4> of the comparison signal CP<1:8>, which is enabled to have a logic "high" level if the fourth count signal AC<4> and the fourth random signal RC<4> have the same logic level. Further, the logic levels of the signals may be different from or the opposite of those described. For example, a signal described as having a logic "high" level may alternatively have a logic "low" level, and a signal described as having a logic "low" level may alternatively have a logic "high" level.

The comparison signal generation circuit 131 may generate a fifth comparison signal CP<5> of the comparison signal CP<1:8>, which is enabled to have a logic "high" level if the fifth count signal AC<5> and the fifth random signal RC<5> have the same logic level. Further, the logic levels of the signals may be different from or the opposite of those described. For example, a signal described as having a logic "high" level may alternatively have a logic "low" level, and a signal described as having a logic "low" level may alternatively have a logic "high" level.

The comparison signal generation circuit 131 may generate a sixth comparison signal CP<6> of the comparison signal CP<1:8>, which is enabled to have a logic "high" level if the sixth count signal AC<6> and the sixth random signal RC<6> have the same logic level. Further, the logic levels of the signals may be different from or the opposite of those described. For example, a signal described as having a logic "high" level may alternatively have a logic "low" level, and a signal described as having a logic "low" level may alternatively have a logic "high" level.

The comparison signal generation circuit 131 may generate a seventh comparison signal CP<7> of the comparison signal CP<1:8>, which is enabled to have a logic "high" level if the seventh count signal AC<7> and the seventh random signal RC<7> have the same logic level. Further, the logic levels of the signals may be different from or the opposite of those described. For example, a signal described as having a logic "high" level may alternatively have a logic "low" level, and a signal described as having a logic "low" level may alternatively have a logic "high" level.

The comparison signal generation circuit 131 may generate an eighth comparison signal CP<8> of the comparison signal CP<1:8>, which is enabled to have a logic "high" level if the eighth count signal AC<8> and the eighth random signal RC<8> have the same logic level. Further, the logic levels of the signals may be different from or the opposite of those described. For example, a signal described as having a logic "high" level may alternatively have a logic "low" level, and a signal described as having a logic "low" level may alternatively have a logic "high" level.

Figure 7:
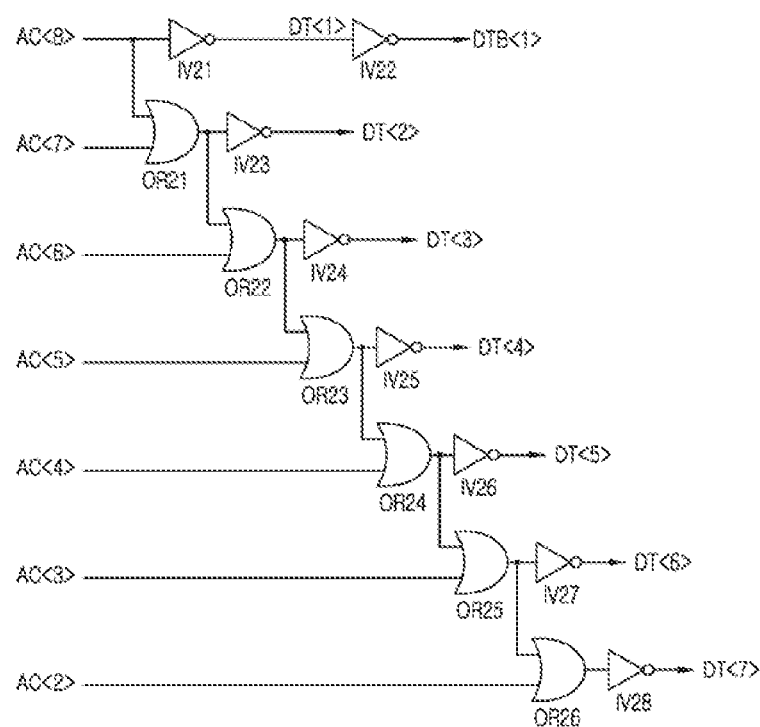
FIG. 7 is a circuit diagram illustrating an example of a representation of a detection signal generation circuit included in the comparison circuit of FIG. 5.

Referring to FIG. 7, an example of the detection signal generation circuit 132 may include logic gates for performing logic operations. The detection signal generation circuit 132 may include logic gates for performing, for example but not limited to, OR operations and inverting operations. The detection signal generation circuit 132 may include, for example but not limited to, OR gates OR21, OR22, OR23, OR24, OR25 and OR26 and inverters IV21, IV22, IV23, IV24, IV25, IV26, IV27 and IV28. As such, the logic levels of the signals as discussed with relation to FIG. 7 may be different from or the opposite of those described. For example, a signal described as having a logic "high" level may alternatively have a logic "low" level, and a signal described as having a logic "low" level may alternatively have a logic "high" level.

For example, the detection signal generation circuit 132 may generate first to sixth detection signals DT<1:6> of the detection signal DT<1:8>, which are enabled to have a logic "high" level if the count signal AC<1:8> is counted until the second count signal AC<2> has a logic "high" level.

For example, the detection signal generation circuit 132 may generate the first to fifth detection signals DT<1:5> which are enabled to have a logic "high" level if the count signal AC<1:8> is counted until the third count signal AC<3> has a logic "high" level.

For example, the detection signal generation circuit 132 may generate the first to fourth detection signals DT<1:4> which are enabled to have a logic "high" level if the count signal AC<1:8> is counted until the fourth count signal AC<4> has a logic "high" level.

For example, the detection signal generation circuit 132 may generate the first to third detection signals DT<1:3> which are enabled to have a logic "high" level if the count signal AC<1:8> is counted until the fifth count signal AC<5> has a logic "high" level.

For example, the detection signal generation circuit 132 may generate the first and second detection signals DT<1:2> which are enabled to have a logic "high" level if the count signal AC<1:8> is counted until the sixth count signal AC<6> has a logic "high" level.

For example, the detection signal generation circuit 132 may generate the first detection signal DT<1> which is enabled to have a logic "high" level if the count signal AC<1:8> is counted until the seventh count signal AC<7> has a logic "high" level.

The detection signal generation circuit 132 may inversely buffer the first detection signal DT<1> to generate a first inverted detection signal DTB<1>.

Figure 8:
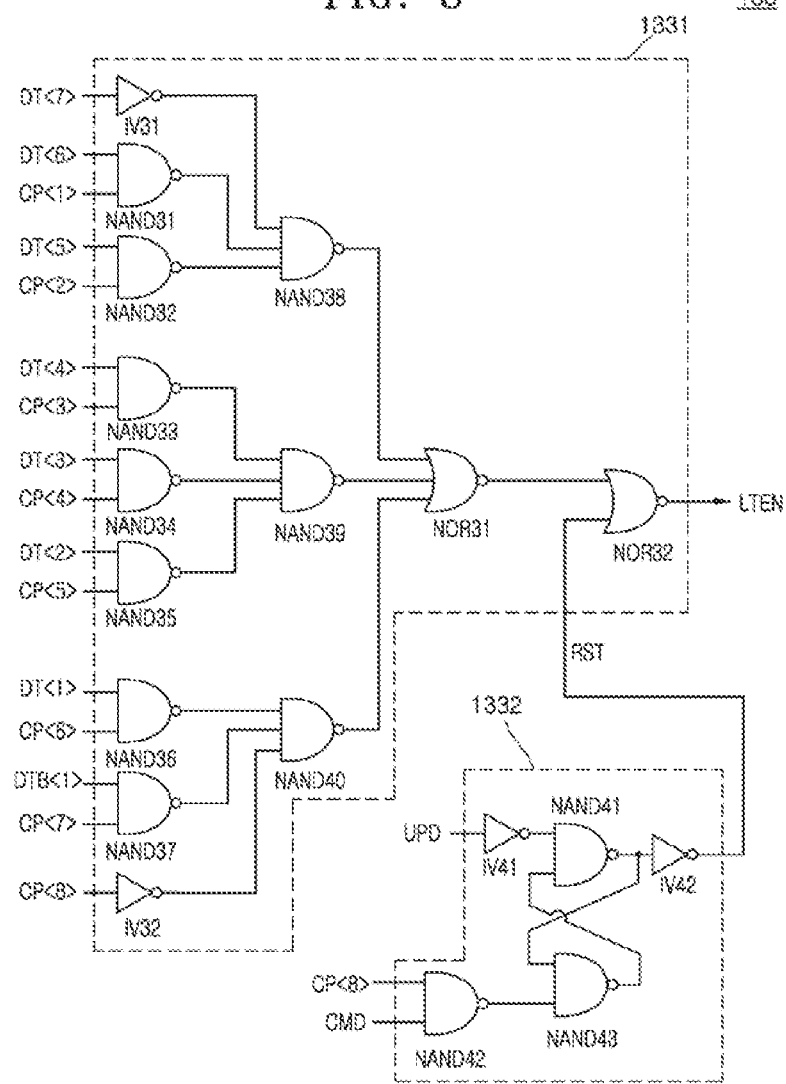
FIG. 8 is a circuit diagram illustrating an example of a representation of an enablement signal generation circuit included in the comparison circuit of FIG. 5.

Referring to FIG. 8, an example of the enablement signal generation circuit 133 may include a logic circuit 1331 and a reset signal generation circuit 1332.

The logic circuit 1331 may include logic gates for performing logic operations. The logic circuit 1331 may include logic gates for performing, for example but not limited to, inverting operations, NAND operations, and NOR operations. The logic circuit 1331 may include, for example but not limited to, inverters IV31 and IV32, NAND gates NAND31, NAND32, NAND33, NAND34, NAND35, NAND36, NAND37, NAND38, NAND39 and NAND40, and NOR gates NOR31 and NOR32. As such, the logic levels of the signals as discussed with relation to FIG. 8 may be different from or the opposite of those described. For example, a signal described as having a logic "high" level may alternatively have a logic "low" level, and a signal described as having a logic "low" level may alternatively have a logic "high" level.

The logic circuit 1331 may generate the enablement signal LTEN which is disabled in response to a reset signal RST. The logic circuit 1331 may generate the enablement signal LTEN which is disabled to have a logic "low" level if the reset signal RST having a logic "high" level is inputted.

The logic circuit 1331 may generate the enablement signal LTEN which is enabled to have a logic "high" level if the first to seventh detection signals DT<1:7> have a logic "high" level. A case that the first to seventh detection signals DT<1:7> have a logic "high" level means that the command CMD and the address ADD are inputted to the semiconductor device once during the set period.

The logic circuit 1331 may generate the enablement signal LTEN which is enabled to have a logic "high" level if the seventh detection signal DT<7> among the first to seventh detection signals DT<1:7> is generated to have a logic "low" level and the first comparison signal CP<1> is generated to have a logic "high" level. A case that the first comparison signal CP<1> has a logic "high" level means that the first count signal AC<1> and the first random signal RC<1> have the same logic level.

The logic circuit 1331 may generate the enablement signal LTEN which is enabled to have a logic "high" level if the sixth and seventh detection signals DT<6:7> among the first to seventh detection signals DT<1:7> are generated to have a logic "low" level and the second comparison signal CP<2> is generated to have a logic "high" level. A case that the second comparison signal CP<2> has a logic "high" level means that the first and second count signals AC<1:2> have the same logic level combination as the first and second random signals RC<1:2>.

The logic circuit 1331 may generate the enablement signal LTEN which is enabled to have a logic "high" level if the fifth to seventh detection signals DT<5:7> among the first to seventh detection signals DT<1:7> are generated to have a logic "low" level and the third comparison signal CP<3> is generated to have a logic "high" level. A case that the third comparison signal CP<3> has a logic "high" level means that the first to third count signals AC<1:3> have the same logic level combination as the first to third random signals RC<1:3>.

The logic circuit 1331 may generate the enablement signal LTEN which is enabled to have a logic "high" level if the fourth to seventh detection signals DT<4:7> among the first to seventh detection signals DT<1:7> are generated to have a logic "low" level and the fourth comparison signal CP<4> is generated to have a logic "high" level. A case that the fourth comparison signal CP<4> has a logic "high" level means that the first to fourth count signals AC<1:4> have the same logic level combination as the first to fourth random signals RC<1:4>.

The logic circuit 1331 may generate the enablement signal LTEN which is enabled to have a logic "high" level if the third to seventh detection signals DT<3:7> among the first to seventh detection signals DT<1:7> are generated to have a logic "low" level and the fifth comparison signal CP<5> is generated to have a logic "high" level. A case that the fifth comparison signal CP<5> has a logic "high" level means that the first to fifth count signals AC<1:5> have the same logic level combination as the first to fifth random signals RC<1:5>.

The logic circuit 1331 may generate the enablement signal LTEN which is enabled to have a logic "high" level if the second to seventh detection signals DT<2:7> among the first to seventh detection signals DT<1:7> are generated to have a logic "low" level and the sixth comparison signal CP<6> is generated to have a logic "high" level. A case that the sixth comparison signal CP<6> has a logic "high" level means that the first to sixth count signals AC<1:6> have the same logic level combination as the first to sixth random signals RC<1:6>.

The logic circuit 1331 may generate the enablement signal LTEN which is enabled to have a logic "high" level if all of the first to seventh detection signals DT<1:7> are generated to have a logic "low" level, the first inverted detection signal DTB<1> is generated to have a logic "high" level, and the seventh comparison signal CP<7> is generated to have a logic "high" level. A case that the seventh comparison signal CP<7> has a logic "high" level means that the first to seventh count signals AC<1:7> have the same logic level combination as the first to seventh random signals RC<1:7>.

The logic circuit 1331 may generate the enablement signal LTEN which is enabled to have a logic "high" level if the eighth comparison signal CP<8> is generated to have a logic "high" level. A case that the eighth comparison signal CP<8> has a logic "high" level means that the first to eighth count signals AC<1:8> have the same logic level combination as the first to eighth random signals RC<1:8>.

The reset signal generation circuit 1332 may include logic gates for performing logic operations. The reset signal generation circuit 1332 may include logic gates for performing, for example but not limited to, NAND operations and inverting operations. The reset signal generation circuit 1332 may include, for example but not limited to, NAND gates NAND41, NAND42 and NAND43 and inverters IV41 and IV42. As such, the logic levels of the signals as discussed with relation to FIG. 8 may be different from or the opposite of those described. For example, a signal described as having a logic "high" level may alternatively have a logic "low" level, and a signal described as having a logic "low" level may alternatively have a logic "high" level.

The reset signal generation circuit 1332 may generate the reset signal RST which is disabled to have a logic "low" level if the update signal UPD having a logic "high" level is inputted. The reset signal generation circuit 1332 may generate the reset signal RST which is enabled to have a logic "high" level if the eighth comparison signal CP<8> is enabled to have a logic "high" level and the command CMD having a logic "high" level is inputted.

An operation of the latch control signal generation circuit 10 will be described hereinafter with reference to FIG. 9 in conjunction with an example in which the count signal AC<1:8> is counted to the extent of the sixth count signal AC<6> and the count signal AC<1:8> is compared with the random signal RC<1:8>.

First, the random signal RC<1:8> may be generated to have a logic level combination of "H,L,L,H,L,L,H,L", and the count signal AC<1:8> may be generated to have a logic level combination of "H,L,L,H,L,H,L,L". In the random signal RC<1:8>, the logic level combination of "H,L,L,H, L,L,H,L" means that the first random signal RC<1> has a logic "high(H)" level, the second random signal RC<2> has a logic "low(L)" level, the third random signal RC<3> has a logic "low(L)" level, the fourth random signal RC<4> has a logic "high(H)" level, the fifth random signal RC<5> has a logic "low(L)" level, the sixth random signal RC<6> has a logic "low(L)" level, the seventh random signal RC<7> has a logic "high(H)" level, and the eighth random signal RC<8> has a logic "low(L)" level. Moreover, in the count signal AC<1:8>, the logic level combination of "H,L,L,H, L,H,L,L" means that the first count signal AC<1> has a logic "high(H)" level, the second count signal AC<2> has a logic "low(L)" level, the third count signal AC<3> has a logic "low(L)" level, the fourth count signal AC<4> has a logic "high(H)" level, the fifth count signal AC<5> has a logic "low(L)" level, the sixth count signal AC<6> has a logic "high(H)" level, the seventh count signal AC<7> has a logic "low(L)" level, and the eighth count signal AC<8> has a logic "low(L)" level.

In the event that the count signal AC<1:8> is counted to the extent of the sixth count signal AC<6>, the sixth count signal AC<6> may be set to be a most significant bit (MSB).

In such a case, the latch control signal generation circuit 10 may generate the latch control signal LTC having a logic "high" level because the sixth count signal AC<6> is set to be a most significant bit (MSB) and the first to fifth count signals AC<1:5> have the same logic level combination as the first to fifth random signals RC<1:5>.

A probability that the address ADD is latched according to the input number of times of the command CMD will be described hereinafter with reference to FIG. 10. For example, in an embodiment, a probability that the address ADD is latched is controlled according to the number of times that the command CMD is inputted to the latch control signal generation circuit 10.

In the event that the command CMD is inputted once, the first count signal AC<1> among the first to eighth count signals AC<1:8> may be counted to have a logic "high" level. In such a case, the first count signal AC<1> may be set to be a most significant bit (MSB), and the address ADD may be latched under a probability of one (i.e., 100%). The probability of one means that the address ADD is latched at a point of time that the command CMD is inputted once.

In the event that the command CMD is inputted twice and three times, the second count signal AC<2> among the first to eighth count signals AC<1:8> may be counted to have a logic "high" level. In such a case, the second count signal AC<2> may be set to be a most significant bit (MSB), and the address ADD may be latched under a probability of 0.5 (i.e., 50%). The probability of 0.5 means that the address ADD is latched at a point of time that the command CMD is inputted twice or at a point of time that the command CMD is inputted three times.

In the event that the command CMD is inputted four times to seven times, the third count signal AC<3> among the first to eighth count signals AC<1:8> may be counted to have a logic "high" level. In such a case, the third count signal AC<3> may be set to be a most significant bit (MSB), and the address ADD may be latched under a probability of 0.25 (i.e., 25%). The probability of 0.25 means that the address ADD is latched at any one moment among points of time that the command CMD is inputted four times, five times, six times and seven times.

Figure 11:
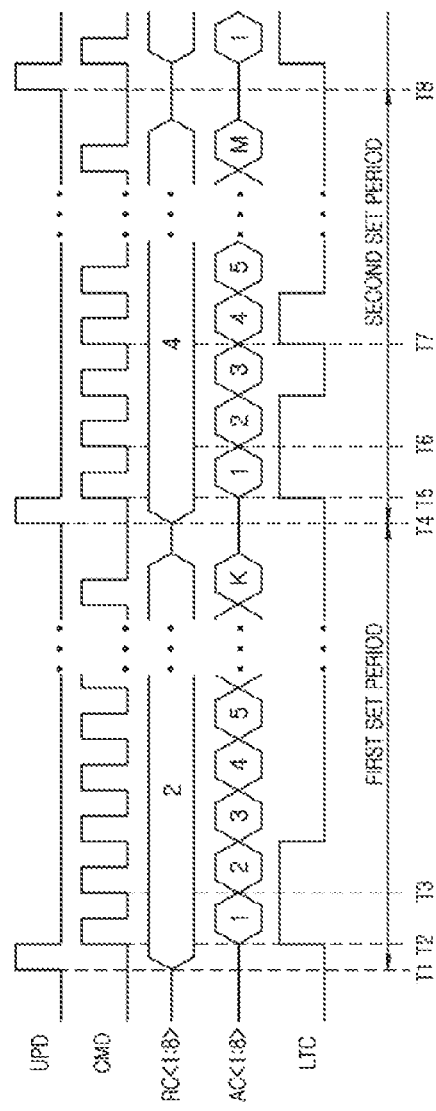
FIG. 11 is a timing diagram illustrating an example of a representation of an operation of a semiconductor device according to an embodiment.

An operation of a semiconductor device according to an embodiment will be described hereinafter with reference to FIG. 11 in conjunction with an example in which an address is latched during a first set period and an example in which the address is latched during a second set period.

At a point of time "T1", the update signal UPD may be inputted to define the first set period. The first set period may be set to be a period from the point of time "T1" till a point of time "T4".

The random signal generation circuit 12 of the latch control signal generation circuit 10 may generate the first to eighth random signals RC<1:8> having a random combination, in response to the update signal UPD. In such a case, the first random signal RC<1> may be generated to have a logic "low" level, and the second random signal RC<2> may be generated to have a logic "high" level. The first and second random signals RC<1:2> may be generated to have the same combination as the first and second count signals AC<1:2> when the command CMD is inputted twice.

At a point of time "T2", the command CMD may be inputted to the counter 11 of the latch control signal generation circuit 10 firstly, and the counter 11 may output the first to eighth count signals AC<1:8> that are counted. In such a case, the first count signal AC<1> among the first to eighth count signals AC<1:8> may be counted to have a logic "high" level.

The comparison circuit 13 of the latch control signal generation circuit 10 may compare the count signal AC<1: 8> with the random signal RC<1:8> to generate the enablement signal LTEN which is enabled to have a logic "high" level. The comparison circuit 13 may generate the enablement signal LTEN which is enabled to have a logic "high" level if the command CMD is inputted to the counter 11 once during the first set period.

The pulse generation circuit 14 of the latch control signal generation circuit 10 may generate a pulse of the latch control signal LTC in response to the command CMD and the enablement signal LTEN.

The storage circuit 20 may latch the address ADD to generate the latched address LADD, in response to the latch control signal LTC.

The internal circuit 30 may receive the latched address LADD to execute an operation for reducing the failures which are due to the row hammering.

At a point of time "T3", the command CMD may be inputted to the counter 11 of the latch control signal generation circuit 10 secondly, and the counter 11 may output the first to eighth count signals AC<1:8> that are counted. In such a case, the first count signal AC<1> among the first to eighth count signals AC<1:8> may be counted to have a logic "low" level, and the second count signal AC<2> among the first to eighth count signals AC<1:8> may be counted to have a logic "high" level.

The comparison circuit 13 of the latch control signal generation circuit 10 may compare the first count signal AC<1> with the first random signal RC<1> to generate the enablement signal LTEN which is enabled to have a logic "high" level, since the second count signal AC<2> is set to be a most significant bit (MSB). The comparison circuit 13 may generate the enablement signal LTEN which is enabled to have a logic "high" level if the command CMD is inputted to the counter 11 twice during the first set period.

The pulse generation circuit 14 of the latch control signal generation circuit 10 may generate a pulse of the latch control signal LTC in response to the command CMD and the enablement signal LTEN.

The storage circuit 20 may latch the address ADD to generate the latched address LADD, in response to the latch control signal LTC.

The internal circuit 30 may receive the latched address LADD to execute an operation for reducing the failures which are due to the row hammering.

At the point of time "T4", the update signal UPD may be inputted to define the second set period. The second set period may be set to be a period from the point of time "T4" till a point of time "T8".

The random signal generation circuit 12 of the latch control signal generation circuit 10 may generate the first to eighth random signals RC<1:8> having a random combination, in response to the update signal UPD. In such a case, the first random signal RC<1> may be generated to have a logic "low" level, the second random signal RC<2> may be generated to have a logic "low" level, and the third random signal RC<3> may be generated to have a logic "high" level. The first to third random signals RC<1:3> may be generated to have the same combination as the first to third count signals AC<1:3> when the command CMD is inputted four times.

At a point of time "T5", the command CMD may be inputted to the counter 11 of the latch control signal generation circuit 10 firstly, and the counter 11 may output the first to eighth count signals AC<1:8> that are counted. In such a case, the first count signal AC<1> among the first to eighth count signals AC<1:8> may be counted to have a logic "high" level.

The comparison circuit 13 of the latch control signal generation circuit 10 may compare the count signal AC<1:8> with the random signal RC<1:8> to generate the enablement signal LTEN which is enabled to have a logic "high" level. The comparison circuit 13 may generate the enablement signal LTEN which is enabled to have a logic "high" level if the command CMD is inputted to the counter 11 once during the second set period.

The pulse generation circuit 14 of the latch control signal generation circuit 10 may generate a pulse of the latch control signal LTC in response to the command CMD and the enablement signal LTEN.

The storage circuit 20 may latch the address ADD to generate the latched address LADD, in response to the latch control signal LTC.

The internal circuit 30 may receive the latched address LADD to execute an operation for reducing the failures which are due to the row hammering.

At a point of time "T6", the command CMD may be inputted to the counter 11 of the latch control signal generation circuit 10 secondly, and the counter 11 may output the first to eighth count signals AC<1:8> that are counted. In such a case, the first count signal AC<1> among the first to eighth count signals AC<1:8> may be counted to have a logic "low" level, and the second count signal AC<2> among the first to eighth count signals AC<1:8> may be counted to have a logic "high" level.

The comparison circuit 13 of the latch control signal generation circuit 10 may compare the first count signal AC<1> with the first random signal RC<1> to generate the enablement signal LTEN which is enabled to have a logic "high" level, since the second count signal AC<2> is set to be a most significant bit (MSB). The comparison circuit 13 may generate the enablement signal LTEN which is enabled to have a logic "high" level if the command CMD is inputted to the counter 11 twice during the second set period.

The pulse generation circuit 14 of the latch control signal generation circuit 10 may generate a pulse of the latch control signal LTC in response to the command CMD and the enablement signal LTEN.

The storage circuit 20 may latch the address ADD to generate the latched address LADD, in response to the latch control signal LTC.

The internal circuit 30 may receive the latched address LADD to execute an operation for reducing the failures which are due to the row hammering.

At a point of time "T7", the command CMD may be inputted to the counter 11 of the latch control signal generation circuit 10 fourthly, and the counter 11 may output the first to eighth count signals AC<1:8> that are counted. In such a case, the first count signal AC<1> among the first to eighth count signals AC<1:8> may be counted to have a logic "low" level, the second count signal AC<2> may be counted to have a logic "low" level, and the third count signal AC<3> may be counted to have a logic "high" level.

The comparison circuit 13 of the latch control signal generation circuit 10 may compare the first and second count signals AC<1:2> with the first and second random signals RC<1:2> to generate the enablement signal LTEN which is enabled to have a logic "high" level, since the third count signal AC<3> is set to be a most significant bit (MSB). The comparison circuit 13 may generate the enablement signal LTEN which is enabled to have a logic "high" level if the command CMD is inputted to the counter 11 four times during the second set period.

The pulse generation circuit 14 of the latch control signal generation circuit 10 may generate a pulse of the latch control signal LTC in response to the command CMD and the enablement signal LTEN.

The storage circuit 20 may latch the address ADD to generate the latched address LADD, in response to the latch control signal LTC.

The internal circuit 30 may receive the latched address LADD to execute an operation for reducing the failures which are due to the row hammering.

As described above, the semiconductor device according to an embodiment may randomly latch the address ADD inputted during the set period to generate samples of the address ADD. The semiconductor device may generate the samples of the address ADD by latching the address ADD inputted during the set period under the same probability. In addition, the semiconductor device may randomly latch the address ADD to detect the address having the same combination. As a result, the failures due to the row hammering may be reduced.

The semiconductor device described with reference to FIGS. 1 to 11 may be applied to an electronic system that includes a memory system, a graphic system, a computing system, a mobile system, or the like. For example, referring to FIG. 12, an electronic system 1000 according an embodiment may include a data storage circuit 1001, a memory controller 1002, a buffer memory 1003, and an input and output (input/output) (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the semiconductor devices illustrated in FIG. 1. The data storage circuit 1001 may generate internal data having logic levels which are internally set regardless of external data and may execute an initialization operation that stores the internal data into a memory cell array. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

Figure 12:
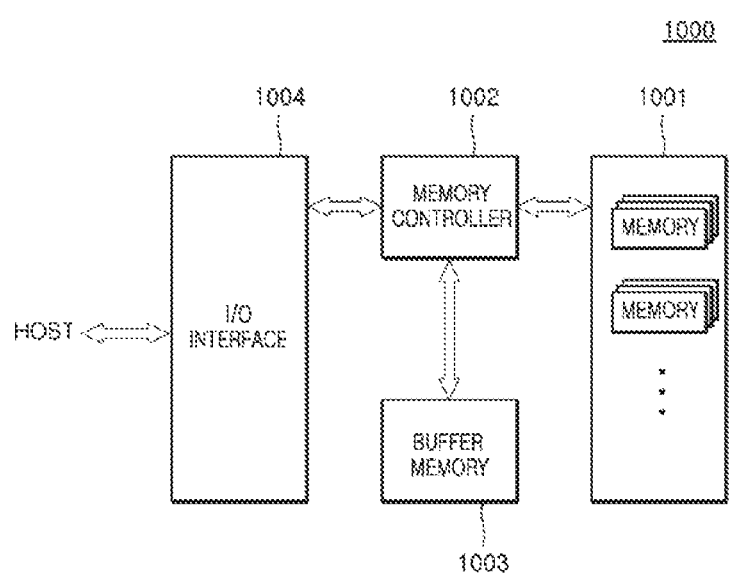
FIG. 12 is a block diagram illustrating an example of a representation of a configuration of an electronic system employing the semiconductor device described with reference to FIGS. 1 to 11.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. The memory controller 1002 may apply data and a strobe signal for strobing the data to the data storage circuit 1001. The strobe signal outputted from the memory controller 1002 may not be toggled during the initialization operation and may be toggled after the initialization operation terminates. Although FIG. 12 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB) drive, a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB drive, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
   a latch control signal generation circuit configured to compare a count signal counted according to the number of times that a command is inputted to the latch control signal generation circuit with a random signal having a random combination to generate a latch control signal which is enabled, based on an update signal;
   a storage circuit configured to latch an address to generate a latched address, based on the latch control signal; and
   an internal circuit configured to receive the latched address to execute an internal operation and perform a refresh operation of memory cells connected to a word line adjacent to a repeatedly selected target word line,
   wherein the update signal includes a pulse which is periodically generated to define a set period.

2. The semiconductor device of claim 1, wherein the address is inputted to the storage circuit at a point of time that the command is inputted to the latch control signal generation circuit.

3. The semiconductor device of claim 1, wherein a probability that the address is latched is controlled according to the number of times that the command is inputted to the latch control signal generation circuit.

4. The semiconductor device of claim 1,
   wherein the address includes a first address that is inputted to the storage circuit at a first point of time that the command is inputted to the latch control signal generation circuit and a second address that is inputted to the store circuit at a second point of time that the command is inputted to the latch control signal generation circuit, during the set period; and
   wherein a probability that the first address is latched by the storage circuit is set to be equal to a probability that the second address is latched by the storage circuit.

5. The semiconductor device of claim 1, wherein the latch control signal generation circuit includes:
   a counter configured to generate the count signal that is counted according to the number of times that the command is inputted to the counter, based on the update signal;
   a random signal generation circuit configured to generate the random signal based on the update signal;
   a comparison circuit configured to compare the count signal with the random signal to generate an enablement signal; and
   a pulse generation circuit configured to generate the latch control signal including a pulse that is created based on the command and the enablement signal.

6. The semiconductor device of claim 5, wherein the counter initializes the count signal if the update signal is inputted to the counter.

7. The semiconductor device of claim 5, wherein the counter generates the count signal that are counted up if the command is inputted, based on the update signal.

8. The semiconductor device of claim 5, wherein the counter generates the count signal that are counted down if the command is inputted, based on the update signal.

9. The semiconductor device of claim 5, wherein the random signal generation circuit generates the random signal having a combination that varies if a pulse of the update signal is inputted to the random signal generation circuit.

10. The semiconductor device of claim 5, wherein the number of bits included in the random signal is equal to the number of bits included in the count signal.

11. The semiconductor device of claim 5, wherein the comparison circuit includes:

a comparison signal generation circuit configured to compare the count signal with the random signal to generate a comparison signal;

a detection signal generation circuit configured to generate a detection signal including information that a most significant bit (MSB) of the count signal is counted; and an enablement signal generation circuit configured to generate the enablement signal which is enabled according to the detection signal and the comparison signal based on the update signal and which is disabled based on the command.

12. The semiconductor device of claim 8, wherein a comparison signal is enabled if the count signal and the random signal have the same combination.

13. The semiconductor device of claim 11, wherein the enablement signal generation circuit includes:

a logic circuit configured to generate the enablement signal which is enabled according to a combination of the detection signal and a combination of the comparison signal, based on a reset signal; and a reset signal generation circuit configured to generate the reset signal which is enabled based on the update signal and which is disabled based on the command and the comparison signal.

14. A semiconductor device comprising:

a comparison circuit configured to compare first to third count signals that are counted according to the number of times that a command is inputted during a set period with first to third random signals having a random combination to generate an enablement signal which is enabled;

a pulse generation circuit configured to generate a latch control signal including a pulse that is created based on the command and the enablement signal;

a storage circuit configured to latch the address to generate a latched address, based on the latch control signal, the set period being defined to be a period in which a pulse of an update signal is periodically generated; and an internal circuit configured to receive the latched address to execute an internal operation and perform a refresh operation of memory cells connected to a word line adjacent to a repeatedly selected target word line.

15. The semiconductor device of claim 14, wherein the address is inputted to the storage circuit at a point of time that the command is inputted.

16. The semiconductor device of claim 14, wherein a probability that the address is latched is controlled according to the number of times that the command is inputted.

17. The semiconductor device of claim 14, wherein the address is latched under a first probability if the command and the address are inputted once;

wherein the address is latched under a second probability if the command and the address are inputted two or three times; and wherein the address is latched under a third probability if the command and the address are inputted four, five, six, or seven times.

18. The semiconductor device of claim 17, wherein the third probability is set to be half the second probability; and wherein the second probability is set to be half the first probability.

19. The semiconductor device of claim 17, wherein a probability that the address inputted a second time is latched is set to be equal to a probability that the address inputted a third time is latched; and wherein a probability that the address inputted a fourth time is latched, a probability that the address inputted a fifth time is latched, a probability that the address inputted a sixth time is latched, and a probability that the address inputted a seventh time is latched are set to be equal to each other.

20. The semiconductor device of claim 14, wherein the comparison circuit includes:

a comparison signal generation circuit configured to generate a comparison signal which is enabled if a combination of the first to third count signals is identical to a combination of the first to third random signals;

a detection signal generation circuit configured to generate a detection signal including information that a most significant bit (MSB) of the first to third count signals is counted; and an enablement signal generation circuit configured to generate the enablement signal which is enabled according to the detection signal and the comparison signal based on the update signal and which is disabled based on the command.

21. The semiconductor device of claim 20, wherein the enablement signal generation circuit includes:

a logic circuit configured to generate the enablement signal which is enabled according to a combination of the detection signal and a combination of the comparison signal, based on a reset signal; and a reset signal generation circuit configured to generate the reset signal which is enabled based on the update signal and which is disabled based on the command and the comparison signal.

22. The semiconductor device of claim 14, further comprising:

a counter configured to generate the first to third count signals that are counted according to the number of times that the command is inputted to the counter, based on the update signal; and a random signal generation circuit configured to generate the first to third random signals based on the update signal.

23. The semiconductor device of claim 22, wherein the counter initializes the first to third count signals if the update signal is inputted to the counter.

24. The semiconductor device of claim 22, wherein the random signal generation circuit generates the first to third random signals having a combination that varies if the update signal is inputted to the random signal generation circuit.

* * * * *